United States Patent
Sauer

(10) Patent No.: US 6,608,526 B1
(45) Date of Patent: Aug. 19, 2003

(54) CMOS ASSISTED OUTPUT STAGE

(75) Inventor: Don R. Sauer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/124,938

(22) Filed: Apr. 17, 2002

(51) Int. Cl.$^7$ ................................................ H03F 3/18
(52) U.S. Cl. ..................... 330/264; 330/255; 330/267; 330/292
(58) Field of Search .............................. 330/255, 264, 330/267, 292, 300, 257

(56) References Cited

U.S. PATENT DOCUMENTS

| | | | | |
|---|---|---|---|---|
| 5,491,448 A | * | 2/1996 | Naokawa et al. | 330/264 |
| 5,754,078 A | * | 5/1998 | Tamagawa | 330/255 |
| 6,384,684 B1 | * | 5/2002 | Redman-White | 330/263 |

* cited by examiner

Primary Examiner—Henry Choe
(74) Attorney, Agent, or Firm—Brett A. Hertzberg; Merchant & Gould

(57) ABSTRACT

An output stage for an operational amplifier includes a dynamically activated CMOS drive circuit that is arranged to improve the drive characteristics of the operational amplifier. The output stage includes bipolar transistors that are arranged to clamp the signal swing at an intermediary node in the operational amplifier. The bipolar transistors activate respective portions of the CMOS drive circuit based on the signal drive at the intermediary node. The CMOS driver circuit includes a p-type field effect transistor that sources additional current into the output signal when active, and an n-type field effect transistor that sinks additional current from the output terminal when active. The output stage may include additional circuitry to ensure that parasitic capacitances associated with the gates of the p-type field effect transistor and the n-type field effect transistors are discharged at appropriate times such that power consumption is reduced and high-speed operation is enhanced.

16 Claims, 2 Drawing Sheets

CMOS ASSISTED OUTPUT STAGE

FIELD OF THE INVENTION

The present invention is related to operational amplifier output stages. More particular, the present invention is related to an output stage that includes a dynamically activated CMOS drive circuit that is arranged to improve the drive characteristics of the operational amplifier. Additional circuitry may be arranged to enhance the high frequency performance of the CMOS drive circuit by discharging critical nodes and reducing the quiescent current of the operational amplifier.

BACKGROUND OF THE INVENTION

Operational amplifiers are a basic building block in electronic systems. Typical operational amplifiers are two-stage amplifiers that include an input stage and an output stage. The input stage is arranged to receive a differential input signal and provide an intermediary signal at an intermediary node. The differential input signal is related to the differential input signal according to a first gain. The output stage is arranged to receive the intermediary signal and provide an output signal to an output node. The output signal is related to the intermediary signal according to a second gain. The output signal is related to the differential input signal according to the product of the first and second gains.

Two-stage operational amplifiers often have high gain levels that may become unstable at high frequencies. Instability in the operational amplifier may cause problems such as oscillations in the output signal. An AC compensation circuit is coupled to a high gain node in the operational amplifier to reduce the gain such that the operational amplifier is stable over all relevant operating frequencies. The AC compensation circuit is often provided between the intermediary node and the output node. The AC compensation circuit reduces high frequency gain by bypassing the output stage.

SUMMARY OF THE INVENTION

Briefly stated, an output stage for an operational amplifier includes a dynamically activated CMOS drive circuit that is arranged to improve the drive characteristics of the operational amplifier. The output stage includes bipolar transistors that are arranged to clamp the signal swing at an intermediary node in the operational amplifier. The bipolar transistors activate respective portions of the CMOS drive circuit based on the signal drive at the intermediary node. The CMOS driver circuit includes a p-type field effect transistor that sources additional current into the output signal when active, and an n-type field effect transistor that sinks additional current from the output terminal when active. The output stage may include additional circuitry to ensure that parasitic capacitances associated with the gates of the p-type field effect transistor and the n-type field effect transistors are discharged at appropriate times such that power consumption is reduced and high-speed operation is enhanced.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

In accordance with the present invention, an output stage is arranged to improve the drive performance of an operational amplifier. An input stage of the operational amplifier provides an intermediary signal to an intermediary node in response to a differential input signal. The output stage includes a transconductance amplifier that is arranged to provide an output signal to a load in response to the intermediary signal. A bipolar transistor circuit is coupled to the intermediary node. A PMOS transistor circuit is arranged to provide additional current drive to the output signal when the intermediary signal swings below a mid-supply voltage by a first predetermined amount. An NMOS transistor circuit is arranged to provide additional current sinking to the output signal when the intermediary signal swings below the mid-supply voltage by a second predetermined amount. The bipolar transistor circuit determines the first and second predetermined amounts. The output stage is arranged such that large capacitive loads may be driven.

Operational amplifiers that are arranged in accordance with the present invention have been implemented using BiCMOS technology. The operational amplifiers provide rail-to-rail input and output performance with a gain-bandwidth of 50 MHz, while drawing 600 uA of quiescent current, and providing 90 mA of drive current to a capacitive load of 1000 pF.

Figure 1:
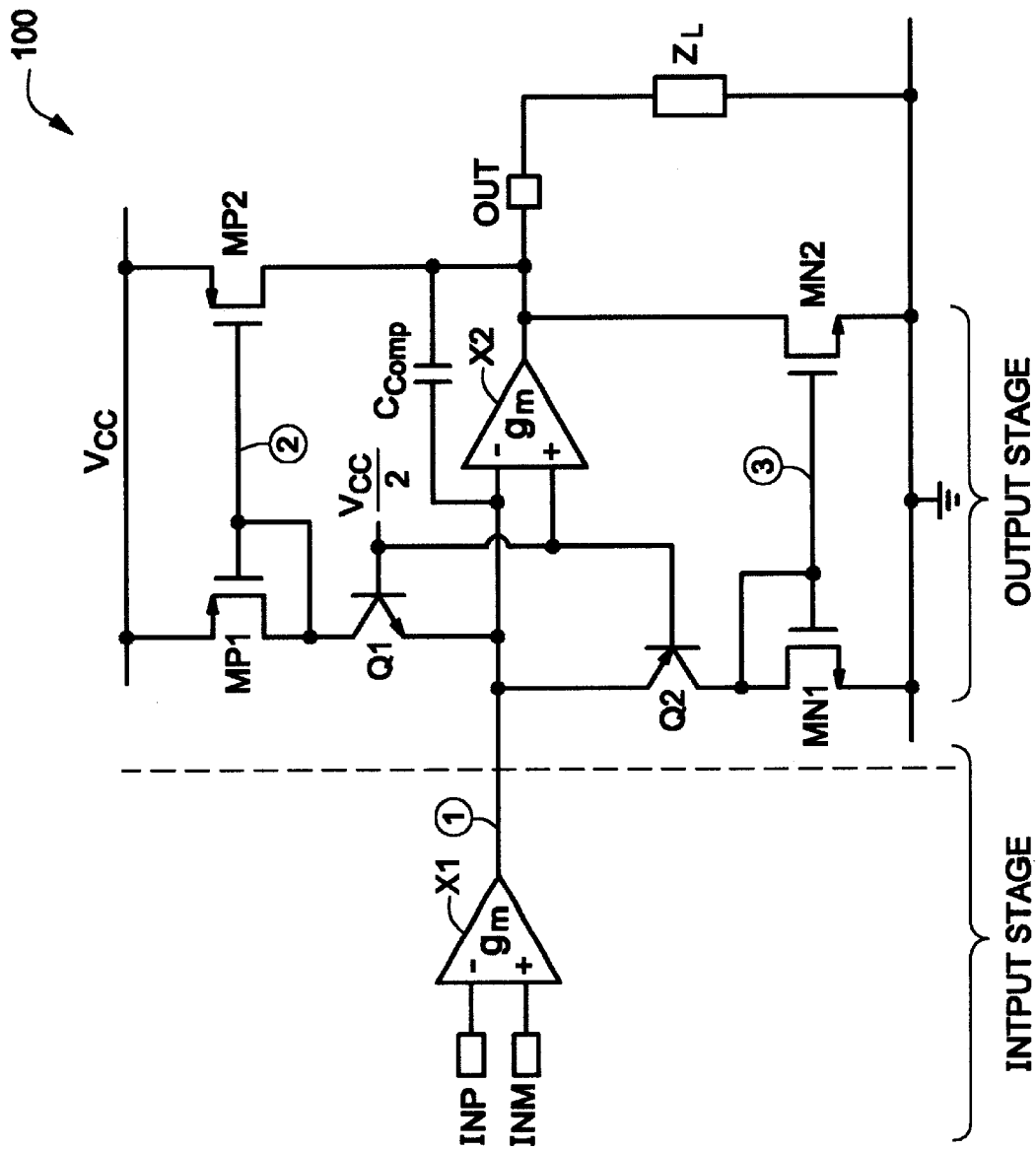
FIG. 1 is a schematic diagram of an operational amplifier that includes an output stage.

FIG. 1 is a schematic diagram of an operational amplifier (100) that includes an exemplary output stage that is arranged in accordance with the present invention. The operational amplifier (100) includes an input stage, an output stage, and a compensation circuit. The input stage includes a first transconductance amplifier (X1). The output stage includes a second transconductance amplifier (X2), a bipolar transistor circuit, a PMOS transistor circuit, and an NMOS transistor circuit. The bipolar transistor circuit includes an NPN transistor (Q1) and a PNP transistor (Q2). The NMOS transistor circuit includes a first NMOS transistor (MN1) and a second NMOS transistor (MN2). The PMOS transistor circuit includes a first PMOS transistor (MP1) and a second PMOS transistor (MP2). The compensation circuit includes a compensation capacitor (Ccomp).

The first transconductance amplifier (X1) includes an inverting input that is coupled to a non-inverting input terminal (INP), a non-inverting input that is coupled to an inverting input terminal (INM), and an output that is coupled to a first node (1). The second transconductance amplifier (X2) includes an inverting input that is coupled to the first node (1), a non-inverting input that is coupled to a mid-supply voltage (Vcc/2), and an output that is coupled to an output terminal (OUT). The NPN transistor (Q1) includes a collector that is coupled to a second node (2), a base that is coupled to the mid-supply voltage (Vcc/2), and an emitter that is coupled to the first node (1). The PNP transistor (Q2) includes a collector that is coupled to a third node (3), a base that is coupled to the mid-supply voltage (Vcc/2), and an emitter that is coupled to the first node (1). The first NMOS transistor (MN1) includes a drain and gate that is coupled to the third node, and a source that is coupled to a circuit ground. The second NMOS transistor (MN2) includes a drain that is coupled to the output terminal (OUT), a gate that is coupled to the third node (3), and a source that is coupled to the circuit ground. The first PMOS transistor (MP1) includes a drain and gate that is coupled to the second node, and a source that is coupled to a power supply voltage (Vcc). The second PMOS transistor (MP2) includes a drain that is coupled to the output terminal (OUT), a gate that is coupled to the second node (2), and a source that is coupled to the power supply voltage (Vcc). Capacitor Ccomp is coupled between node 1 and the output terminal to provide stable operation of the operational amplifier.

In operation, a differential input signal is applied across the differential input terminals (INP, INM) and a load (ZL) is coupled to the output terminal. The first transconductance amplifier provides an intermediary signal to the first node (1) in response to the differential input signal. The second transconductance amplifier is arranged to provide an output signal to the output terminal when the intermediary signal has a level that is sufficiently low such that the bipolar transistor circuit is inactive. Transconductance amplifier X2 will drive the output terminal to equalize node 1 to the same voltage as the non-inverting input of transconductance amplifier X2. Under typical operating conditions, node 1 will have an associated voltage that corresponds to the mid-supply voltage, which is coupled to the non-inverting input of the second transconductance amplifier (X2). Transistors Q1 and Q2 are biased by the mid-supply voltage such that neither transistor is active when the first node corresponds to the mid-supply voltage.

Transistor Q1 is active when the voltage associated with node 1 decreases below the mid-supply voltage by a first predetermined amount (amt1), and transistor Q2 is active when the voltage associated with node 1 increases above the mid-supply voltage by a second predetermined amount (amt2). The first predetermined amount (amt) corresponds to the forward bias voltage of transistor Q1 (e.g., 0.6V), while the second predetermined amount (amt2) corresponds to the forward bias voltage of transistor Q2 (e.g., −0.6V). The bipolar transistor circuit is arranged to operate as a peak detector circuit that detects peaks in the signal swing of the first node (1) above the mid-supply voltage. Also, each of transistors Q1 and Q2 limits the signal swing at the first node (1) such that the voltage associated with the first node (1) does not swing beyond mid-supply voltage by the first and second predetermined amounts.

Transconductance amplifier X2 provides current to load ZL when the voltage associated with the first node (1) is below the mid-supply voltage (Vcc/2). Transistor MP2 is arranged to provide additional current to the load (ZL) to assist transconductance amplifier X2 when the drive associated with the first node (1) is sufficient to activated transistor Q1. The PMOS circuit is inactive when transistor Q1 is inactive. Thus, when the voltage associated with the first node (1) is greater than ([Vcc/2]−amt1), transistors MP1 and MP2 are also inactive and no current is provided to the load from transistor MP2. Transistor Q1 is forward biased such that current flows through transistor MP1 when the voltage associated with the first node (1) is less than ([Vcc/2]−amt1). Transistor MP1 is arranged in a current-mirror configuration with transistor MP2 such that transistor MP2 is biased in active operation when transistor MP1 is active. Transistor MP2 is arranged to provide additional current drive to the load (ZL) when active.

Transconductance amplifier X2 sinks current from load ZL when the voltage associated with the first node (1) is above the mid-supply voltage (Vcc/2). Transistor MN2 is arranged to sink additional current from load ZL such that transconductance amplifier X2 is assisted when the drive associated with the first node (1) is sufficient to activated transistor Q2. The NMOS circuit is inactive when transistor Q2 is inactive. Thus, when the voltage associated with the first node (1) is less than ([Vcc/2]+amt2), transistors MN1 and MN2 are also inactive and no current sinking from the load is provided by transistor MN2. Transistor Q2 is forward biased such that current flows through transistor MN1 when the voltage associated with the first node (1) is greater than ([Vcc/2]+amt2). Transistor MN1 is arranged in a current-mirror configuration with transistor MN2 such that transistor MN2 is biased in active operation when transistor MN1 is active. Transistor MN2 is arranged to provide additional current sinking from load ZL when active.

In one example, transconductance amplifiers X1 and X2 are bipolar transistor amplifiers. The nodes in the bipolar transistor amplifier may be clamped such that the base-emitter junctions are prevented from zenering under certain operating conditions. The bipolar transistor circuit described previously above is arranged to limit (or clamp) the inverting input of the second transconductance amplifier. The clamping of transistors in the bipolar transistor amplifier may result in limited output current capabilities. The MOS circuits described-above are arranged to provide additional sourcing and sinking currents such that the MOS circuits assist the bipolar transistor amplifiers in driving the load. The MOS circuits also assist the output signal swing in achieving rail-to-rail performance.

Figure 2:
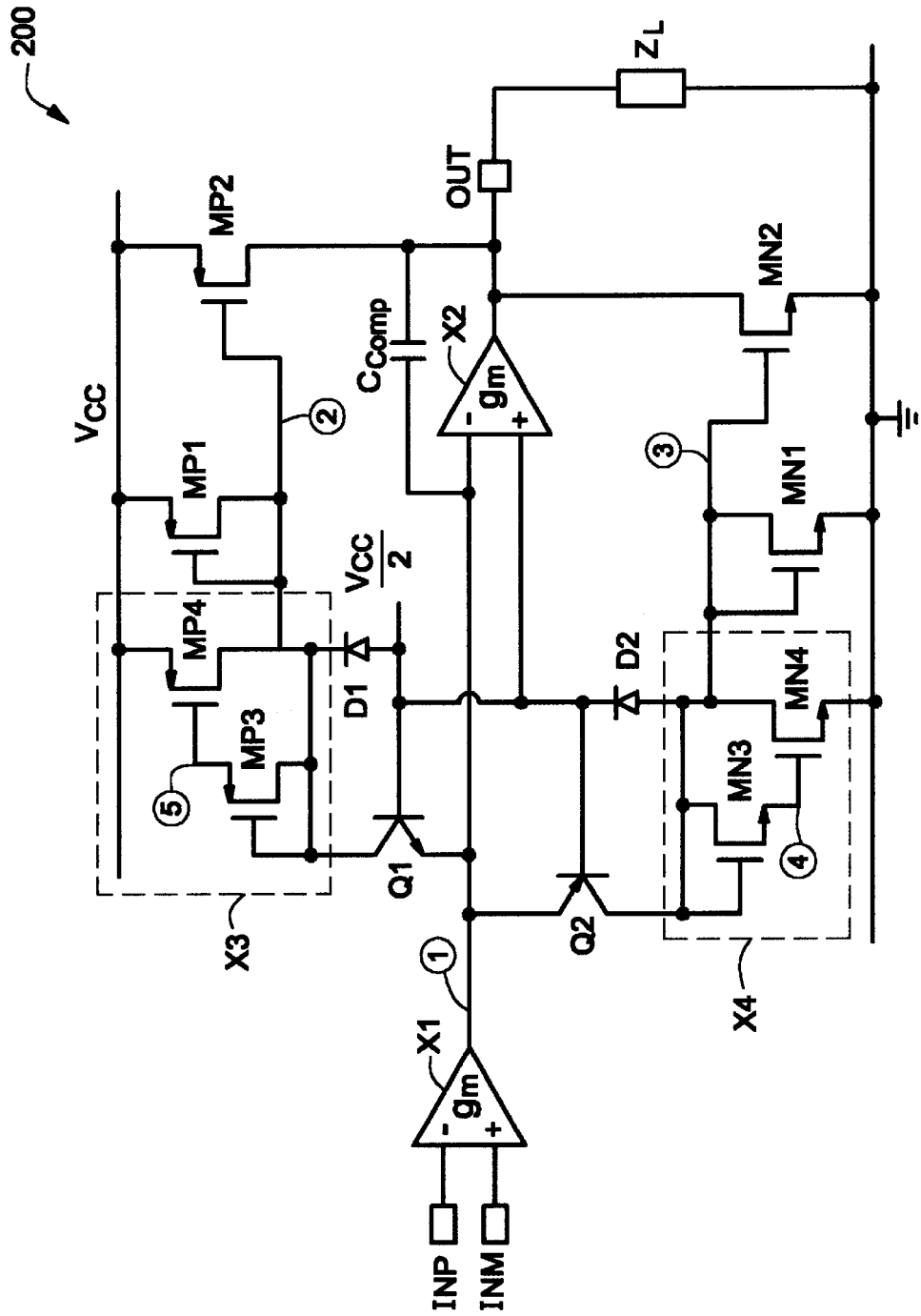
FIG. 2 is a schematic diagram of another operational amplifier that includes an output stage, in accordance with the present invention.

FIG. 2 is a schematic diagram of another operational amplifier (200) that includes an exemplary output stage that is arranged in accordance with the present invention. The operational amplifier (200) includes an input stage, an output stage, and a compensation circuit. The input stage includes a first transconductance amplifier (X1). The output stage includes a second transconductance amplifier (X2), a bipolar transistor circuit, a PMOS transistor circuit, an NMOS transistor circuit, a pair of clamp circuits, and a pair of peak detector circuits. The bipolar transistor circuit includes an NPN transistor (Q1) and a PNP transistor (Q2). The NMOS transistor circuit includes a first NMOS transistor (MN1) and a second NMOS transistor (MN2). The PMOS transistor circuit includes a first PMOS transistor (MP1) and a second PMOS transistor (MP2). The compensation circuit includes a compensation capacitor (CCOMP). Each clamp circuit includes a diode (D1, D2). The peak detector circuits (X3, X4) include a third NMOS transistor (MN3), a fourth NMOS transistor (MN4), a third PMOS transistor (MP3), and a fourth PMOS transistor (MP4).

The arrangement of like parts and nodes are labeled identically in FIG. 1 and FIG. 2. FIG. 2 is similar to FIG. 1, except for the addition of the clamp circuits, and the peak detector circuits (X3, X4). Diode D1 is coupled between node 2 and the mid-supply voltage (Vcc/2). Diode D2 is coupled between the mid-supply voltage (Vcc/2) and node 3. The third NMOS transistor (MN3) includes a drain and gate that are coupled to node 3, and a source that is coupled to node 4. The fourth NMOS transistor (MN4) includes a drain that is coupled to node 3, a gate that is coupled to node 4, and a source that is coupled to the circuit ground. The third PMOS transistor (MP3) includes a drain and gate that are coupled to node 2, and a source that is coupled to node 5. The fourth PMOS transistor (MP4) includes a drain that is coupled to node 2, a gate that is coupled to node 5, and a source that is coupled to the power supply voltage (Vcc).

The basic operation of the operational amplifier described in FIG. 2 is substantially similar to the operation described with respect to FIG. 1. However, the additional clamp and peak detector circuits are arranged to enhance the high frequency performance of the circuit, and to minimize the overall power consumption. Transistor MP1 and MP2 include parasitic capacitances that are associated with node 2. Similarly, transistors MN1 and MN2 include parasitic capacitances that are associated with node 3. When the intermediary signal at node 1 changes rapidly, transistors Q1 and Q2 are activated and deactivated in a short time interval. The parasitic capacitances at nodes 2 and 3 store charge when their respective conduction paths are active via transistors Q1 and Q2. The parasitic capacitances associated with nodes 2 and 3 may store sufficient charge such that transistors MP2 and MN2 are active at the same time, resulting in high current consumption.

Transistors MN3 and MN4 are arranged in a configuration that is similar to a Darlington pair. Transistor MN4 has a parasitic capacitance associated with the gate at node 4. Transistors MN3 provides a charge conduction path to node 4 when active such that the gate of transistor MN4 is charged. Transistor MN3 is active when the voltage associated with node 3 corresponds to two threshold voltages above the circuit ground. The voltage associated with node 3 corresponds to two threshold voltages above the circuit ground when the load (ZL) is demanding heavier current sinking (a hard drive condition). Thus, the parasitic capacitance at node 4 is charged and transistor MN4 is activated when the hard drive condition is present (Q2 is active). When transistor MN3 is deactivated there is no conduction path (other than leakage) to discharge node 4, and transistor MN4 remains active even though transistor Q2 is inactive. Transistor MN4 is arranged to discharge the parasitic capacitance at node 3 when transistor Q2 turns off, such that transistor MN2 is deactivated and power consumption is reduced. Transistors MN3–MN4 are arranged to shut off transistor MN2 to enhance high-speed performance of the operational amplifier.

Transistors MP3 and MP4 are also arranged in a configuration that is similar to a Darlington pair. Transistor MP4 has a parasitic capacitance associated with the gate at node 5. Transistors MP3 provides a charge conduction path from node 5 when active such that the gate of transistor MP4 is charged low. Transistor MP3 is active when the voltage associated with node 2 corresponds to two threshold voltages below the supply voltage. The voltage associated with node 2 corresponds to two threshold voltages below the supply voltage when the load (ZL) is demanding heavier current drive (a hard drive condition). Thus, the parasitic capacitance at node 5 is charged low and transistor MP4 is activated when the hard drive condition is present (Q1 is active). When transistor MP3 is deactivated there is no conduction path (other than leakage) to discharge node 5, and transistor MP4 remains active even though transistor Q1 is inactive. Transistor MP4 is arranged to discharge the parasitic capacitance at node 2 to the power supply voltage (Vcc) when transistor Q1 turns off, such that transistor MP2 is deactivated and power consumption is reduced. Transistors MP3–MP4 are arranged to shut off transistor MP2 to enhance high-speed performance of the operational amplifier.

Diode D1 is couples to across the base and collector of transistor Q2 such that the collector voltage of transistor Q2 is limited. The collector voltage of transistor Q2 is limited to a diode voltage below the mid-supply voltage (Vcc/2). Diode D1 is thus arranged to operate as a clamp circuit that limits the collector voltage and prevents transistor Q2 from becoming saturated. Similarly, diode D2 is coupled across the base and collector of transistor Q1 such that the collector voltage of transistor Q1 is limited. The collector voltage of transistor Q1 is limited to a diode voltage above the mid-supply voltage (Vcc/2). Diode D2 is thus arranged to operate as a clamp circuit that limits the collector voltage and prevents transistor Q1 from becoming saturated.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus, comprising:
   a transconductance amplifier that includes a first input that is coupled to a first node, a second input that is coupled to a mid-supply voltage, and an output that is coupled to an output terminal, wherein the transconductance amplifier is arranged to provide an output signal to the output terminal in response to an input signal at the first node;
   a bipolar transistor circuit that includes a first bipolar transistor and a second bipolar transistor, wherein the first bipolar transistor includes an emitter that is coupled to the first node, a base that is coupled to the mid-supply voltage, and a collector that is coupled to a second node, and wherein the second bipolar transistor includes an emitter that is coupled to the first node, a base that is coupled to the mid-supply voltage, and a collector that is coupled to a third node, wherein the first bipolar transistor is active when the input signal swings below the mid-supply voltage by a first predetermined amount, and the second bipolar transistor is active when the input signal swings above the mid-supply voltage by a second predetermined amount;
   a PMOS circuit that includes a p-type transistor, wherein the p-type transistor includes a drain that is coupled to the output terminal, a gate that is coupled to the second node, and a source that is coupled to a power supply voltage, wherein the PMOS circuit is activated when the first bipolar transistor is active; and
   an NMOS circuit that includes an n-type transistor, wherein the n-type transistor includes a drain that is coupled to the output terminal, a gate that is coupled to the third node, and a source that is coupled to a circuit ground, wherein the NMOS circuit is activated when the second bipolar transistor is active.

2. An apparatus as in claim 1, the NMOS circuit further comprising another n-type transistor that includes a gate and drain that are coupled to the third node, and a source that is coupled to the circuit ground such that the n-type transistor and the other n-type transistor are arranged in a current mirror configuration.

3. An apparatus as in claim 1, the PMOS circuit further comprising another p-type transistor that includes a gate and drain that are coupled to the second node, and a source that is coupled to the power supply such that the p-type transistor and the other p-type transistor are arranged in a current mirror configuration.

4. An apparatus as in claim 1, the NMOS circuit further comprising another n-type transistor that includes a gate and drain that are coupled to the third node, and a source that is coupled to the circuit ground such that the n-type transistor and the other n-type transistor are arranged in a current mirror configuration; and the PMOS circuit further comprising: another p-type transistor that includes a gate and drain that are coupled to the second node, and a source that is coupled to the power supply such that the p-type transistor and the other p-type transistor are arranged in another current mirror configuration.

5. An apparatus as in claim 1, further comprising a compensation circuit that is coupled between the first node and the output terminal.

6. An apparatus as in claim 1, wherein the first predetermined amount corresponds to a forward voltage drop that is associated with the first bipolar transistor and the second predetermined amount corresponds to another forward voltage drop that is associated with the second bipolar transistor.

7. An apparatus, comprising:
a transconductance amplifier that includes a first input that is coupled to a first node, a second input that is coupled to a mid-supply voltage, and an output that is coupled to an output terminal, wherein the transconductance amplifier is arranged to provide an output signal to the output terminal in response to an input signal at the first node;
an n-type bipolar transistor that includes an emitter that is coupled to the first node, a base that is coupled to the mid-supply voltage, and a collector that is coupled to a second node, wherein the n-type bipolar transistor is active when the input signal swings below the mid-supply voltage by a first predetermined amount;
a first p-type field effect transistor that includes a drain and gate that are coupled to the second node, and a source that is coupled to a power supply voltage, wherein the first p-type field effect transistor is active when the n-type bipolar transistor is active; and
a second p-type field effect transistor that includes a gate that is coupled to the second node, a drain that is coupled to the output terminal, and a source that is coupled to the power supply voltage, wherein the second p-type field effect transistor is active when the first p-type field effect transistor is active such that additional current is provided to the output terminal from the second p-type field effect transistor when the mid-supply voltage exceeds the input signal by the first predetermined amount.

8. An apparatus as in claim 7, further comprising a clamp circuit that is arranged to clamp the collector voltage of the n-type bipolar transistor such that the n-type bipolar transistor is operates in a non-saturated operating condition.

9. An apparatus as in claim 7, further comprising a third p-type field effect transistor that includes a gate and drain that are coupled to the second node, and a source that is coupled to a fifth node, and a fourth p-type field effect transistor that includes a drain that is coupled to the second node, a gate that is coupled to the fifth node, and a source that is coupled to the power supply voltage, wherein the third p-type field effect transistor is arranged to charge the gate of the fourth p-type field effect transistor such that a parasitic capacitance that is associated with the second node is discharged by the fourth p-type field effect transistor when the n-type bipolar transistor is inactive.

10. An apparatus as in claim 7, further comprising a third p-type field effect transistor that includes a gate and drain that are coupled to the second node, and a source that is coupled to a fifth node, a fourth p-type field effect transistor that includes a drain that is coupled to the second node, a gate that is coupled to the fifth node, and a source that is coupled to the power supply voltage, and a diode circuit that is coupled between the base and collector of the n-type bipolar transistor, wherein the third p-type field effect transistor is arranged to charge the gate of the fourth p-type field effect transistor such that a parasitic capacitance that is associated with the second node is discharged by the fourth p-type field effect transistor when the n-type bipolar transistor is inactive, and the diode circuit is arranged to clamp the collector voltage of the n-type bipolar transistor such that the n-type bipolar transistor is operates in a non-saturated operating condition.

11. An apparatus as in claim 7, further comprising:
a p-type bipolar transistor that includes an emitter that is coupled to the first node, a base that is coupled to the mid-supply voltage, and a collector that is coupled to a third node, wherein the p-type bipolar transistor is active when the input signal swings above the mid-supply voltage by a second predetermined amount;
a first n-type field effect transistor that includes a drain and gate that are coupled to the third node, and a source that is coupled to a circuit ground, wherein the first n-type field effect transistor is active when the p-type bipolar transistor is active; and
a second n-type field effect transistor that includes a gate that is coupled to the third node, a drain that is coupled to the output terminal, and a source that is coupled to the circuit ground, wherein the second n-type field effect transistor is active when the first n-type field effect transistor is active such that the second p-type field effect transistor sinks additional current from the output terminal when the input signal exceeds the mid-supply voltage by the second predetermined amount.

12. An apparatus as in claim 11, further comprising a clamp circuit that is arranged to clamp the collector voltage of the p-type bipolar transistor such that the p-type bipolar transistor is operates in a non-saturated operating condition.

13. An apparatus as in claim 11, further comprising a third n-type field effect transistor that includes a gate and drain that are coupled to the third node, and a source that is coupled to a fourth node, and a fourth n-type field effect transistor that includes a drain that is coupled to the third node, a gate that is coupled to the fourth node, and a source that is coupled to the circuit ground, wherein the third n-type field effect transistor is arranged to charge the gate of the fourth n-type field effect transistor such that a parasitic capacitance that is associated with the second node is discharged by the fourth n-type field effect transistor when the p-type bipolar transistor is inactive.

14. An apparatus as in claim 11, further comprising a third n-type field effect transistor that includes a gate and drain that are coupled to the third node, and a source that is coupled to a fourth node, a fourth n-type field effect transistor that includes a drain that is coupled to the third node, a gate that is coupled to the fourth node, and a source that is coupled to the circuit ground, and a diode circuit that is coupled between the base and collector of the p-type bipolar transistor, wherein the third n-type field effect transistor is arranged to charge the gate of the fourth n-type field effect transistor such that a parasitic capacitance that is associated with the third node is discharged by the fourth n-type field effect transistor when the p-type bipolar transistor is inactive, and the diode circuit is arranged to clamp the collector voltage of the p-type bipolar transistor such that the p-type bipolar transistor is operates in a non-saturated operating condition.

15. An apparatus as in claim 11, further comprising a compensation capacitor that is coupled between the first node and the output terminal.

16. An apparatus as in claim 11, further comprising another transconductance amplifier that is arranged to provide the input signal to the first node in response to a differential input signal.

* * * * *